(12) United States Patent
Pan et al.

(10) Patent No.: US 7,192,866 B2
(45) Date of Patent: Mar. 20, 2007

(54) SOURCE ALTERNATING MOCVD PROCESSES TO DEPOSIT TUNGSTEN NITRIDE THIN FILMS AS BARRIER LAYERS FOR MOCVD COPPER INTERCONNECTS

(75) Inventors: Wei Pan, Vancouver, WA (US); David R. Evans, Beaverton, OR (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/326,712

(22) Filed: Dec. 19, 2002

(65) Prior Publication Data

US 2004/0121596 A1 Jun. 24, 2004

(51) Int. Cl.
*H01L 21/44* (2006.01)

(52) U.S. Cl. .................. 438/687; 438/627; 438/643; 438/653; 438/679; 438/680; 438/681; 257/E21.17; 257/E21.584

(58) Field of Classification Search ............... 438/685, 438/627, 643, 653, 679–681
See application file for complete search history.

(56) References Cited

U.S. PATENT DOCUMENTS 6,534,395 B2* 3/2003 Werkhoven et al. ........ 438/627

2002/0009544 A1* 1/2002 McFeely et al. ......... 427/248.1
2003/0143328 A1* 7/2003 Chen et al. ............ 427/255.28
2003/0198587 A1* 10/2003 Kaloyeros et al. .......... 423/409

OTHER PUBLICATIONS

Article entitled, "Low temperature metal-organic chemical vapor deposition of tungsten nitride as diffusion barrier for copper metalization." by Jean K. Kelsey et al., published in J. Vac. Sci. Technol. B 17(3) May/Jun. 1999, pp. 1101-1104.

Article entitled, "$WN_x$ diffusion barriers between Si and Cu" by Masaki Uekubo et al., published in Thin Solid Films 286 (1996), pp. 170-175.

Article entitled, "Properties of reactively sputtered $WN_x$ as Cu diffusion barrier." by Bong-Seok Suh et al., published in Thin Solid Films 348 (1999), pp. 299-303.

* cited by examiner

*Primary Examiner*—Walter Lindsay, Jr.
*Assistant Examiner*—Kyoung Lee
(74) *Attorney, Agent, or Firm*—Robert D. Varitz, PC

(57) ABSTRACT

An alternating source MOCVD process is provided for depositing tungsten nitride thin films for use as barrier layers for copper interconnects. Alternating the tungsten precursor produces fine crystal grain films, or possibly amorphous films. The nitrogen source may also be alternated to form WN/W alternating layer films, as tungsten is deposited during periods where the nitrogen source is removed.

10 Claims, 1 Drawing Sheet

SOURCE ALTERNATING MOCVD PROCESSES TO DEPOSIT TUNGSTEN NITRIDE THIN FILMS AS BARRIER LAYERS FOR MOCVD COPPER INTERCONNECTS

BACKGROUND OF THE INVENTION

The invention relates to the MOCVD of barrier metal thin films, more specifically for use in connection with CVD copper interconnects.

Diffusion barriers are commonly used in integrated circuit (IC) fabrication to prevent interdiffusion of metals. For example, a TiN film is used to prevent diffusion of Al into Si at contact regions and along metal lines. As the dimensions of ICs, particularly contact regions and metal lines, continue to shrink, the requirements for the conducting barrier also become more stringent. Thinner barriers are required without substantially increasing resistivity. Barriers also need to be more resistant to diffusion of various new metals, which are being introduced into production processes. One of the metals that is being introduced is copper. Although few diffusion barriers materials effectively block the diffusion of copper, metal nitride, for example tungsten nitride, has been shown to act as good barriers against copper diffusion.

Tungsten Nitride (WN) films have been deposited in the past using reactive sputtering, chemical vapor deposition (CVD) from tungsten hexafluoride ($WF_6$) and ammonia ($NH_3$), and metal-organic CVD using tungsten hexacarbonyl $W(CO)_6$ and $NH_3$.

SUMMARY OF THE INVENTION

Accordingly, a source alternating CVD (SACVD) process for forming WN barrier layers is provided. The SACVD process comprises heating a substrate within a CVD chamber and introducing an alternating source $W(CO)_6$ precursor into the CVD chamber, while providing an $NH_3$ source; whereby the $W(CO)_6$ and $NH_3$ react to deposit WN onto the heated substrate. The $NH_3$ source may be held steady to produce WN thin films, or alternated as well to produce alternating WN/W thing films.

The substrate is heated to a temperature between about 200° C. and 450° C. within a CVD chamber at a pressure of between about 200 mtorr and 1,000 mtorr. An alternating source $W(CO)_6$ precursor may be introduced into the CVD chamber by sublimating a solid $W(CO)_6$ precursor and delivering it into the CVD chamber by turning a hydrogen carrier gas, which has a flow rate of between about 10 and 200 sccm during the on-state, on and off according to a sequence with a on/off period that varies from about 25 seconds/5 seconds to 5 seconds/25 seconds. An $NH_3$ source is also introduced into the CVD chamber at a flow rate of between about 20 sccm and 50 sccm, whereby the $W(CO)_6$ and $NH_3$ react to deposit WN onto the heated substrate.

DETAILED DESCRIPTION OF THE INVENTION

A source alternating CVD (SACVD) process is provided for depositing thin films for semiconductor applications.

Figure 1:
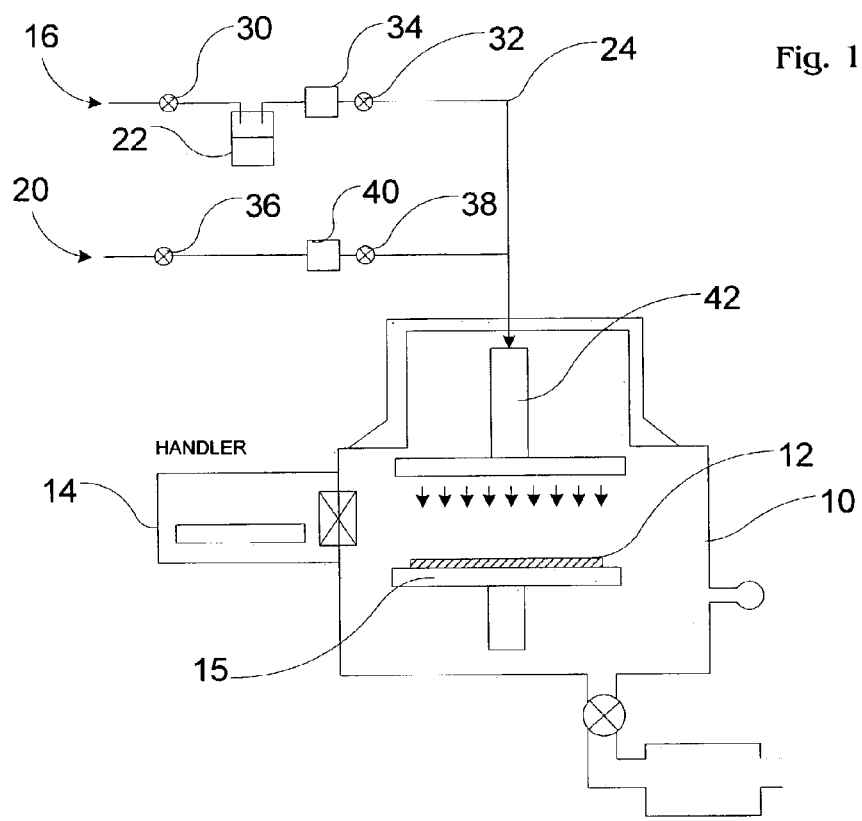
FIG. 1 shows a schematic illustration of an MOCVD chamber using a solid precursor.

FIG. 1 shows a schematic illustration of a CVD chamber 10 for performing an MOCVD process. A substrate 12 is placed within the CVD chamber 10. The substrate 12 is introduced into the chamber 10 through a handler 14 and positioned on a chuck 15. Precursor sources are shown schematically to illustrate the use of a solid precursor source 16, and a gas precursor source 20.

If a solid precursor is used, an ampule 22 and delivery lines 24 are heated to cause sublimation of the solid precursor into a precursor gas. The resulting precursor gas is then delivered into the chamber 10 by a carrier gas, such as hydrogen, nitrogen, or a noble gas, such as helium, neon, or argon. A first gas inlet valve 30 is used to control the flow of the carrier gas into the ampule 22. A first chamber valve 32 is used to control the flow of the carrier gas and precursor into the chamber 10. In addition, a first mass flow controller 34 is used to further regulate the flow rate into the chamber 10.

Gas precursors may also be introduced through a second gas inlet valve 36. The gas precursor is also controlled using a second chamber valve 38, possibly in combination with a second mass flow controller 40.

Both precursors, once in gas form, are distributed uniformly onto a heated substrate surface through a shower head 42, also referred to as a gas distributor.

In the case of MOCVD WN, a solid precursor, such as tungsten hexacarbonyl $W(CO)_6$, and a gaseous precursor $NH_3$ are used to deposit WN films through thermal activated reactions. The $W(CO)_6$ precursor is carried into a deposition chamber by a carrier gas, for example hydrogen. The $NH_3$ precursor is delivered into the chamber directly.

Figure 2:
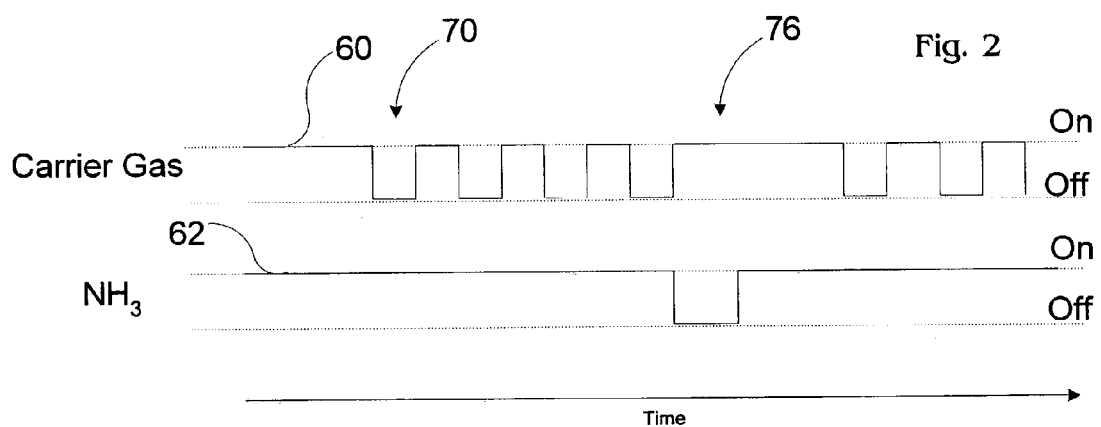
FIG. 2 shows a process cycle alternating over time.

Pneumatic valves 30, 32, 36, and 38, as well as mass flow controllers (MFCs) 34, and 40 are used to control the "on/off" and flow rate of $H_2$ and $NH_3$. FIG. 2 illustrates shows an example operating sequence. The $H_2$ can be turned on and off as indicated by sequence 60. Alternating the $H_2$ causes the tungsten source that it carries to alternate. The $NH_3$ can also be turned on and off as indicated by sequence number 62. Keeping the $NH_3$ on while $H_2$ alternates, as shown in region 70, allows the incoming tungsten source time to fully react with the $NH_3$ for full nitridation of the resulting film. Therefore, the as deposited films have a high density. The alternating source will also produce a smaller grain size than that produced without alternating the source, due to the grain growth being on and off in accordance with the $H_2$ flow.

If the $NH_3$ is turned off, while allowing the $H_2$ to either remain on, or alternate, will produce a layer of W. By alternately, turning the $NH_3$ on and off, as shown in region 76, it is possible to produce films of WN/W in alternating layers. These alternating layers will produce even finer grains, or possibly amorphous films, as well as providing films with low resistivity values.

As shown in FIG. 2, sequences of keeping $NH_3$ steady while alternating $H_2$, region 70, can be combined with sequences that alternate $H_2$ while keeping $NH_3$ steady, region 76, to tailor the film, or film stack, and its corresponding properties to accommodate specific applications.

This source alternating CVD (SACVD) is flexible for tailoring the material composition and properties. SACVD has a higher deposition rate than ALCVD, since it does not require a self-limiting process of depositing single molecular layers at a time. The SACVD process is capable for producing layers that are more than a single molecular layer thick during each cycle. This also makes it easier to implement as the pressure and temperature ranges do not have to be as carefully controlled.

The SACVD process for $W(CO)_6$ and $NH_3$ can be done at temperatures in the range between about 200 and 450° C. The ability to use process temperatures in the range below about 400° C. is preferable for integrating WN barrier layers with porous low-k materials, which are being considered for interconnect applications below 0.1 micron generation. Through source alternation, the as-deposited films may have high density, low resistivity, and very fine crystalline grains, or an amorphous structure, desirable for copper barrier applications. Illustrative examples are provided below.

EXAMPLE 1

The chamber 10 is provided at a pressure of between about 200 mtorr and 1000 mtorr. The substrate 12 is placed on the chuck 15 and heated to a temperature of between about 351 and 450° C.

The Source Alternating CVD (SACVD) process is employed to deposit WN thin films. The solid precursor ampule 22 is provided with $W(CO)_6$. The ampule and feed lines are heated to sublimate the $W(CO)_6$. An $H_2$ flow rate is set between 10 to 200 sccm for the on-state to deliver the $W(CO)_6$ into the chamber 10. The off-state is essentially 0 sccm, such that the flow is turned off. The $H_2$ flow rate has an "on/off" period that varies from 25 seconds on and 5 seconds off, to 5 seconds on and 25 seconds off during the deposition cycle.

An $NH_3$ source having a flow rate in the range of about 20 to 50 sccm is also provided to introduce a source of nitrogen into the chamber 10. The $NH_3$ source remains on continuously to deposit WN.

The process continues until a WN film of between about 5 nm and 7 nm is deposited. The actual process time necessary to produce the desired thin film thickness will vary depending on specific values chosen form within the identified ranges, but can be readily ascertained without undue experimentation.

EXAMPLE 2

The chamber 10 is provided at a pressure of between about 200 mtorr and 1000 mtorr. The substrate 12 is placed on the chuck 15 and heated to a temperature of between about 351 and 450° C.

The Source Alternating CVD (SACVD) process is employed to deposit WN thin films. The solid precursor ampule 22 is provided with $W(CO)_6$. The ampule and feed lines are heated to sublimate the $W(CO)_6$. An $H_2$ flow rate is set between 10 to 200 sccm for the on-state to deliver the $W(CO)_6$ into the chamber 10. The off-state is essentially 0 sccm, such that the flow is turned off.

An $NH_3$ source having a flow rate in the range of about 20 to 50 sccm in the on-state is also provided to introduce a source of nitrogen into the chamber 10. The $NH_3$ source remains on during WN deposition and turned off to produce layers of W. The $NH_3$ source is turned off for between about 5 and 25 seconds. By alternating the $NH_3$ it is possible to produce alternating WN/W films.

The process continues until a WN/W film of between about 5 nm and 7 nm is deposited. The actual process time necessary to produce the desired thin film thickness will vary depending on specific values chosen form within the identified ranges, but can be readily ascertained without undue experimentation.

What is claimed is:

1. A source alternating CVD process for forming tungsten-containing barrier layers comprising:
   a) heating a substrate within a CVD chamber;
   b) introducing an alternating source of a $W(CO)_6$ precursor into the CVD chamber;
   c) introducing $NH_3$ gas into the chamber throughout at least one cycle of the alternating source of a $W(CO)_6$ precursor; whereby the $W(CO)_6$ and $NH_3$ react to deposit WN onto the heated substrate; and
   d) turning the $NH_3$ gas on and off to provide for, when the $NH_3$ gas is off, deposition of a tungsten layer, thereby forming alternating layers of WN/W to produce a low resistance tungsten-containing film.

2. The process of claim 1, wherein the substrate is heated to a temperature between about 200° C. and 450° C.

3. The process of claim 1, wherein the substrate is heated to a temperature between about 351° C. and 400° C.

4. The process of claim 1, wherein the alternating source $W(CO)_6$ precursor is introduced into the chamber by an alternating source of carrier gas.

5. The process of claim 4, wherein the alternating source of carrier gas is hydrogen.

6. The process of claim 5, wherein the hydrogen has an on-state flow rate between about 10 sccm and 200 sccm.

7. The process of claim 6, wherein the hydrogen has an on/off period that varies from about 25 seconds/5 seconds to 5 seconds/25 seconds.

8. The process of claim 1, wherein the chamber pressure is between about 200 mtorr and 1,000 mtorr.

9. The process of claim 1, wherein the $NH_3$ source has an on-state flow rate of between about 20 sccm and 50 sccm.

10. A source alternating CVD process for forming tungsten-containing barrier layers comprising:
   a) heating a substrate to a temperature between about 200° C. and 450° C. within a CVD chamber at a pressure of between about 200 mtorr and 1,000 mtorr;
   b) providing an alternating source of a $W(CO)_6$ precursor into the CVD chamber by sublimating a solid $W(CO)_6$ precursor and delivering it into the CVD chamber by turning a hydrogen carrier gas having a flow rate of between about 10 sccm and 200 sccm on and off according to a sequence with a on/off period that varies from about 25 seconds/5 seconds to 5 seconds/25 seconds;
   c) delivering an $NH_3$ gas into the CVD chamber at a flow rate of between about 20 sccm and 50 sccm throughout at least one cycle of the $W(CO)_6$ precursor, whereby the $W(CO)_6$ and $NH_3$ react to deposit WN onto the heated substrate; and
   d) turning the $NH_3$ gas on and off to provide for, when the $NH_3$ gas is off, deposition of a tungsten layer, thereby forming alternating layers of WN/W to produce a low resistance tungsten-containing film.

* * * * *